United States Patent [19]

Valdmanis

[11] Patent Number: 4,891,580
[45] Date of Patent: Jan. 2, 1990

[54] ELECTRO-OPTIC MEASUREMENTS OF VOLTAGE WAVEFORMS ON ELECTRICAL CONDUCTORS

[75] Inventor: Janis A. Valdmanis, Westfield, N.J.

[73] Assignee: American Telephone and Telegraph Co., AT&T Bell Laboratories, Murray Hill, N.J.

[21] Appl. No.: 182,063

[22] Filed: Apr. 29, 1988

[51] Int. Cl.$^4$ .................. G01R 31/00; G01R 33/00; G01R 23/16
[52] U.S. Cl. .................................. 324/96; 324/77 K; 324/117 R; 350/356
[58] Field of Search .................. 324/96, 77 K, 117 R; 356/364, 365; 350/356, 374, 376

[56] References Cited

U.S. PATENT DOCUMENTS

| | | | |
|---|---|---|---|
| 4,446,425 | 5/1984 | Valdmanis et al. | 324/77 |
| 4,618,819 | 10/1986 | Mourou et al. | 324/77 |
| 4,681,449 | 7/1987 | Bloom et al. | 356/364 |

OTHER PUBLICATIONS

Nees, J. et al. *Electron. Lett.*, vol. 22, No. 17, p. 318, (1986).
Freeman, J. L. et al. *Appl. Phys. Lett.*, vol. 47, No. 10, p. 1083, (1985).
Valdmanis, J. A. et al., "Optoelectronics II", *Proc. Second OSA-IEEE (LEOS)*, Nevada, Jan. 14–16, 1987, pp. 4–10.
Weingarten, K. J. et al., "Picosecond Sampling of GaAs Integrated Circuits", *Proc. Second OSA-IEEE, (LEOS)*, Nevada, Jan. 14–16, 1987, pp. 18–24.
Williamson, S. et al., "Picosecond Electro-Electron Optic Oscilloscope", *Picosecond Electronics and Optoelectronics, Proc. of the Toptical Meeting*, Mar. 13–15, 1985, Lake Tahoe, Nevada.

*Primary Examiner*—Ernest F. Karlsen
*Attorney, Agent, or Firm*—Peter A. Businger

[57] ABSTRACT

The longitudinal electro-optic effect is used with an external probe to make voltage measurements on electrical conductors.

20 Claims, 2 Drawing Sheets

ELECTRO-OPTIC MEASUREMENTS OF VOLTAGE WAVEFORMS ON ELECTRICAL CONDUCTORS

BACKGROUND OF THE INVENTION

This invention relates to testing of electronic circuits and, more particularly, to electro-optic techniques for making such measurements.

The need for non-invasive testing of integrated circuits and devices is rapidly becoming more apparent. The increasing speed and complexity of current and future circuitry has already exceeded the capabilities of conventional allelectronic testing techniques. In recent years, picosecond laser systems have been applied to a variety of optically based measurement schemes for making electrical waveform measurements at internal circuit nodes. However, some techniques are restricted by being applicable to only a particular material system or by the necessity of operation in vacuum.

External electro-optic (e-o) probing techniques exploit the fact that two-dimensional circuits have an open electrode structure which gives rise to fringing fields above the surface of the circuit. See, for example, J. Nees et al, *Electron Lett.*, Vol. 22, No. 17, p. 318 (1986) and G. Mourou an J. A. Valdmanis (this applicant), U.S. Pat. No. 4,618,819 issued on Oct. 21, 1986. Dipping a minute e-o crystal probe into these fields changes the crystal's birefringence, which can then be measured optically; that is, by a pulsed light beam which is passed through the e-o crystal and is reflected from the circuit. The advantage of such external probes is that they can be applied to almost any type circuit, because the interaction is based on a field effect. Since no charge is removed from the circuit, the probe does not need to make electrical contact to the circuit.

All external probes to date have relied on the transverse e-o effect in lithium tantalate. Lithium tantalate is a well-known e-o material that exhibits a relative large e-o effect, but only in the transverse geometry. In this geometry, the optic axis of the e-o material is transverse to the direction of the light beam and parallel to the surface of the circuit. Consequently, the e-o probes are sensitive only to fields parallel to the surface of the circuit. These transverse fields exist mainly between conductors on the surface which are at different potentials. In order to measure the signal on a particular conductor, an AC ground has to be provided on an adjacent conductor. The probe is then centered between these two conductors. But, since two-dimensional circuits have all their conductors in the same plane, there can be many overlapping transverse fields at any one point on the surface of the circuit, leading to crosstalk at the probing point. Sensitivity of the probes also depends on conductor spacings and widths, since both parameters affect transverse field strength. In practice, these effects can be avoided only by careful electrode layout. In addition, because the fringing field strength decreases rapidly with height above a conductor, the probe-to-conductor spacing has to be carefully controlled, rendering the transverse e-o technique unsuitable for many applications.

In contrast, longitudinal e-o probing has not been utilized in external probes, but has been demonstrated in GaAs circuits, where the GaAs substrate itself is electro-optic. Because the substrate is part of the circuit under test, this technique will be referred to as "internal" e-o probing. As described by J. L. Freeman et al, *Appl. Phys. Lett.*, Vol. 47, No. 10, p. 1083 (1985), this technique involves directing the light beam through the backside of the substrate and reflecting it from conductors on the front side. Electric fields generated in the substrate induce birefringence which is measured by the light beam. Thus, this technique cannot be used to test integrated circuits formed on non-electro-optic substrates; e.g., the entire class of silicon ICs on silicon substrates is excluded, as are hybrid ICs such as GaAs ICs on silicon substrates, circuits on ceramic substrates, and printed circuit boards.

SUMMARY OF THE INVENTION

The voltage waveform associated with an electrical conductor disposed on a substrate surface is measured by positioning the tip of an electro-optic (e-o) crystal over the conductor and directing a light beam through the crystal to the conductor. The crystal exhibits a longitudinal e-o effect; that is, only electric field components parallel to the direction of the light beam induce birefringence in the crystal. Since the light beam is typically directed perpendicular to the substrate surface, only electric field components which are essentially perpendicular to the conductor/substrate surface are sensed. The polarization of the light beam is modulated by the birefringence changes induced in the crystal, with the resulting modulation being proportional to the integral of electric field (i.e., the voltage) between the conductor and the back surface of the crystal. In a preferred embodiment, the back surface of the crystal may be maintained at a reference potential (e.g., ground) by means of a conductive layer disposed thereon.

This invention offers several distinct advantages over prior art external e-o probing techniques: reduced sensitivity to conductor linewidth and spacing, thereby making it easier to calibrate the test equipment; reduced sensitivity to conductor-to-probe spacing, thereby reducing the complexity of sophisticated servo-control mechanisms; reduced crosstalk from adjacent conductors, thereby increasing the signal-to-noise ratio of measurements; elimination of the need for an AC ground reference, thereby simplifying the test equipment; and enabling the voltage of a specific conductor to be measured directly rather than measuring the fringing field between adjacent conductors from which the voltage can, at best, be only inferred. Relative to prior art internal e-o probing techniques, the invention has the following advantages: elimination of the need for an e-o substrate in order to test an IC, thereby enabling commercially significant products (e.g., silicon ICs on silicon substrates) to be tested; elimination of the need to direct the light beam through the back side of the substrate, thereby rendering it moot whether the substrate itself or layers on its backside (e.g., metalization) are of optical quality, are transparent, or have to be provided with special openings to permit ingress of the beam.

The invention is capable of picosecond temporal resolution and micrometer spatial resolution by using a light beam comprised a picosecond pulses focused to a micrometer-size spot.

BRIEF DESCRIPTION OF THE DRAWINGS

The invention, together with its various features and advantages, can be readily understood from the following more detailed description taken in conjunction with accompanying drawing, in which.

DETAILED DESCRIPTION

Figure 1:
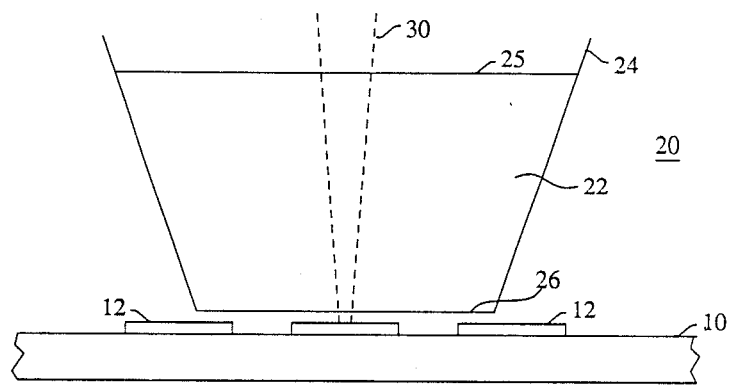
FIG. 1 is a schematic view of e-o voltage sampling probe in accordance with one embodiment of the invention.

Turning now to FIG. 1, there is shown a substrate 10 having a plurality of conductors 12 on a surface thereof. Illustratively, the substrate and conductors are part of an integrated circuit. The probe 20 includes an electrooptic (e-o) tip 22 mounted on a transparent support 24. The end face of the tip is positioned over or on the conductor whose voltage waveform is to be sampled. Sampling is performed optically by short-duration pulses of a polarized light beam 30 which is directed through the support into the tip. Beam 30 is typically reflected from the conductor itself, but it may also be reflected by an optional reflector 26 disposed on the end face of the tip. The latter may be desirable in cases where the circuit is sensitive to light.

In order to effect voltage measurements, the e-o crystal of the tip comprises a material which exhibits a longitudinal e-o effect; that is, a field-induced birefringence in response only to electric field components parallel to the direction of beam 30. Since the beam is directed perpendicular to the conductor surface, only field components perpendicular to that surface induce the desired birefringence. In this regard, the material itself need not have an inherent birefringence. Thus, cubic crystals such as ZnTe are suitable, although those having inherent birefringence such as KDP are also included.

Figure 2:
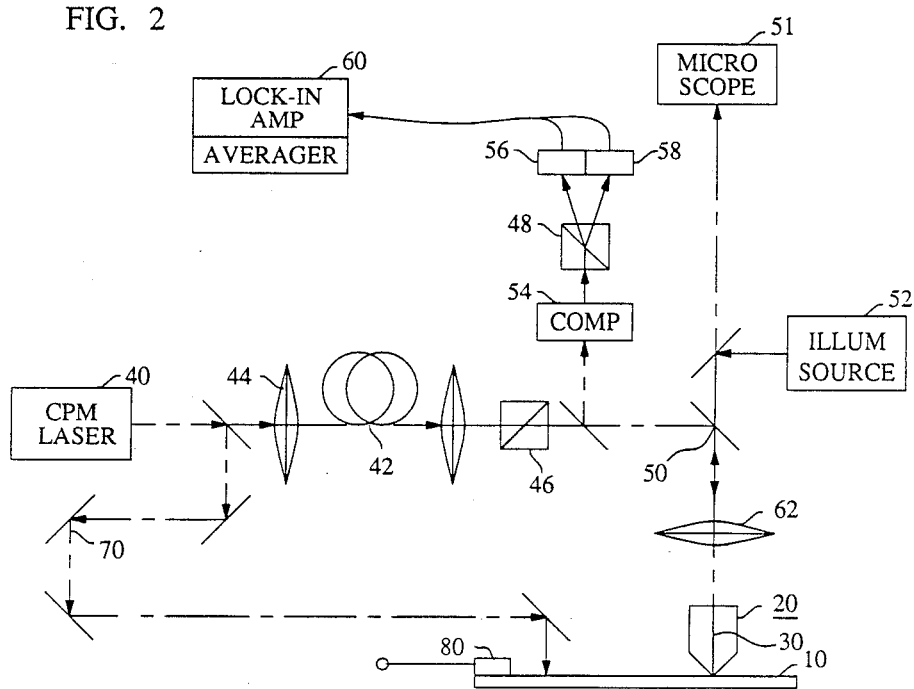
FIG. 2 is a schematic of apparatus for use in conjunction with the probe of FIG. 1 for making voltage measurements on ICs.

In order to measure the waveform on conductor 12 the apparatus of FIG. 2 is utilized. Sampling pulses (e.g., 100 fs in duration) are generated by a laser 40, preferably a well-known balanced colliding pulse mode-locked (CPM) dye laser, and are directed into the samping apparatus via a polarization preserving single-mode optical fiber 42 and a microscope objective 44. The probe tip 20 is mounted optically (not physically) between crossed polarizers 46 and 48 and below a dichroic beamsplitter 50 in such a way as to facilitate viewing of the tip end face from above via a microscope system 51. Light of a wavelength different from that of the laser is injected from source 52 through the beamsplitter 50 to illuminate the conductor below the tip. In this way, both the conductor and the sampling beam spot can be seen together. Quartz compensating plates 54 are includes between the polarizers to operate the e-o crystal at a "zero-order" quarter wave point. Polarizer 48, which is a wollaston analyzer, is used to separate orthogonal polarizations and direct the output to dual differential light detectors 56 and 58. The detector output is then fed to a lock-in amplifier and signal averager 60. The entire sampling system, except for the laser, is mounted vertically on a conventional probing station above the stage on which the substrate is placed. The probe tip is then brought down to any suitable point on or above the substrate for sampling the voltage waveform of a selected conductor.

A voltage waveform may be generated on the conductor by coupling a test signal thereto (or to the circuit of which it is a part) either electrically via a suitable (e.g., high speed) electrical connection 80 or optically via optical delay line 70 coupled to a photodetector (not shown) on the substrate 10. In either case, well-known sampling techniques are utilized so that the optical pulses and the waveform being measured are synchronized and the optical pulses are scanned across the waveform to be sampled.

In operation, polarized beam 30 is illustratively used to sense change in the birefringence induced in the e-o crystal. When the conductor being measured has zero voltage on it, then the reflected beam (immediately before polarizer 48) has orthgonal polarization components which are 90° out of phase with one another. These components are separated by the wollaston prism 48 and generate equal signals (balanced outputs) from detectors 56 and 58. However, when the voltage on the conductor is not zero, the birefringence induced in the crystal is changed and an additional phase shift is produced between the two orthgonal components; i.e., the reflected beam is elliptically polarized, resulting in an imbalanced output from detectors 56 and 58 and a signal from lock-in amplifier/averager 60 whichis proportional to the voltage on the conductor.

Illustratively, the probe tip 22 comprises a 100 $\mu m$ thick piece of KD*P (deuterated potassium di-hydrogen phosphate), and the support 24 is a short fused silica rod bonded to the tip. The tip is polished as a four-sided pyramid having a half angle of 30 degrees with the end face of the tip being less than 40 $\mu m$ on a side. Other tip geometries (e.g., a cone) are also suitable. The optic axis of the KD*P is essentially perpendicular to the end face of the tip. A high reflectance dichroic coating 26 may be evaporated onto the tip end face so the sampling beam can be reflected back to the optical system. A microscope objective 62 is used both to focus the sampling beam onto the tip end face and to recollimate the reflected beam.

The substrate 10 is mounted below the probe tip on a standard vacuum chuck. The conductors on the substrate (i.e., the circuit) are energized via either a waveform synthesizer (not shown) coupled to high speed connection 80 and synchronized with the laser or via an electrical signal from a photodetector (not shown) illuminated by the laser pulses from delay line 70. Electrical connections to the circuit may be made by conventional probes, a probe card, or wire bonding. Relative delay between trigger and sampling times is introduced by a motor-driven optical delay line 70, although purely electronic means, in some cases, can also be utilized. Utilizing apparatus of this type with optical pulses of about 100 fs duration, it is expected that measurement bandwidths in excess of 1 THz (1000 GHz) can be attained.

Suitable e-o materials which have a significant longitudinal e-o effect include KD*P, KDP and CuCl (all three for probe beam wavelengths $\lambda \geq$ visible), GaAs ($\lambda > 1.0 \mu m$), ZnTe ($\lambda > 0.6 \mu m$) and CdTe ($\lambda > 0.9 \mu m$).

In these materials, as noted above, an e-o effect is experienced only for electric field components directed parallel to the optical beam, hence the name "longitudinal". When used as probe tips, these materials are, therefore, sensitive only to fields perpendicular to the surface of the conductor, i.e., longitudinal fields. These fields are strongest directly above a conductor, hence probing is also done directly over or on the conductor of interest. Locations and potentials of nearby conductors are irrelevant since they do not contribute to the longitudinal field strength over the conductor of interest.

The measured signal for this type of longitudinal e-o probe is proportional to the integral of the electric field in the e-o medium along the line of the optical beam. Hence, if the backface of the e-o crystal is at a reference (e.g., ground or zero) potential, the integral of the electric field is exactly the potential at the conductor if the tip touches the conductor; if instead a constant gap is maintained between the tip and conductor, then the measured voltage differs from the actual voltage only by a constant. Thus, in either case the signal is proportional to the conductor's voltage. To ensure zero potential the backface of the tip 22 should be grounded; e.g., as shown in FIG. 1, by means of a conductive layer 25 which is disposed on the backface and is connected to ground.

Figure 3:
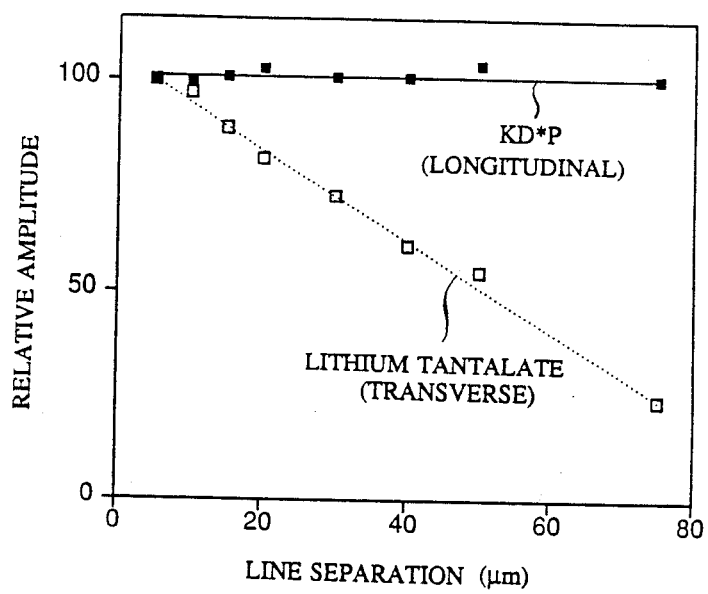
FIG. 3 is a graph of electric field measurements comparing one embodiment of the invention (KD*P probe) with prior art transverse e-o probing (lithium tantalate probe)

Low frequency experiments show that the predicted dependences do actually hold in practice. FIG. 3 shows the measured signal dependence on line separation for a prior art lithium tantalate transverse probe compared with a longitudinal KD*P probe in accordance with the invention. The test circuit consisted of two 10 micron wide lines separated by varying amounts, with one line grounded and the other driven with a 1 volt peak-to-peak sine wave at 1 kHz. The figure clearly shows that the lithium tantalate probe signal is strongly affected by line spacing, while the KD*P longitudinal probe exhibits a signal independent on line spacing, indicative of a constant longitudinal field and constant potential, or voltage.

Figure 4:
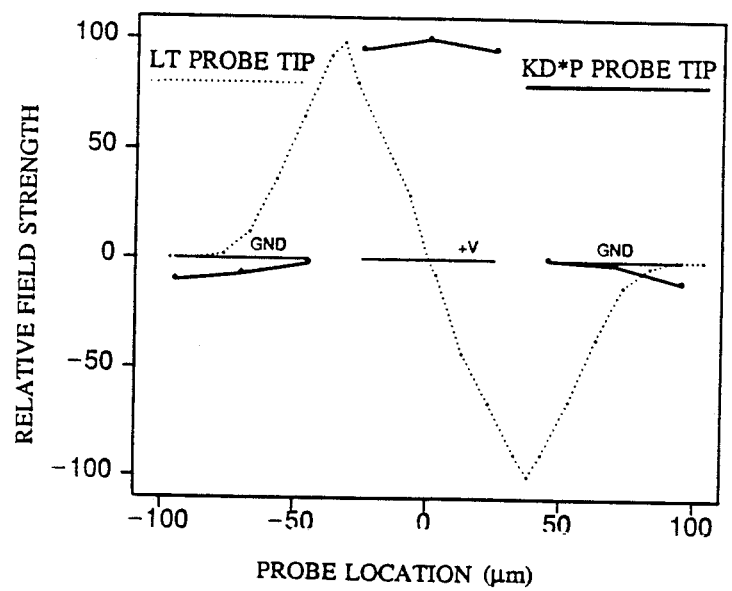
FIG. 4 is a graph showing the insensitivity to conductor separation when measurements are made using one embodiment of the invention (KD*P probe) as compared with prior art transverse e-o probing (lithium tantalate (LT) probe).

Other experiments that investigate the KD*P tip's behavior as a function of line width and crosstalk support the longitudinal field mechanism as a true "voltage" type probe. FIG. 4 is instructive. Here, a lithium tantalate probe was scanned across three parallel conductors (two outer ones at ground potential and the center one at +V). The measured field strength is a triangular waveform which clearly peaks *between* the conductors, and therefore is not directly a measurement of voltage. In contrast, the KD*P probe measures nearly constant field strength above each conductor, a direct measure of voltage. This type of probe, whether using KD*P of some other longitudinal e-o material, is clearly superior to transverse type probes for high-speed node measurements on two-dimensiona dimensional devices and integrated circuits.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, the invention can be practiced in the transmission mode, rather than the reflection mode described above (e.g., where the conductors are transparent to beam 30 or have apertures therethrough). In this case, of course, the substrate 10 would likewise be transparent.

I claim:

1. A method of measuring a voltage waveform of an electrical signal on an electrical conductor comprising:
    generating the signal oon the conductor;
    positioning a crystal, which exhibits longitudinal electro-optic effect, over or on the conductor,
    directing a polarized light beam through the crystal along a direction essentially perpendicular to the conductor, birefringence being induced in the crystal and the polarization of the beam being modulated in response essentially to only those components of the electric field generated by the signal which are perpendicular to the conductor, and
    detecting the modulated polarization of the beam to generate a voltage waveform corresponding to that on the conductor.

2. The method of claim 1 wherein the crystal is selected from the group consisting of KDP, KD*P, GaAs, ZnTe, CdTe, and CuCl.

3. The method of claim 1 wherein the crystal has an end face which is positioned over or on the conductor and a backface which is maintained at a reference-potential.

4. The method of claim 3 wherein the beam is reflected from the end of the crystal positioned over or on the conductor and is thereafter detected.

5. The method of claim 1 wherein the beam is reflected from the conductor and is thereafter detected.

6. The method of claim 1 wherein the directing step includes generating the light beam as a train of optical pulses having a duration of about a picosecond or less.

7. The method of claim 6 wherein the pulses are generated by a laser.

8. The method of claim 7 wherein the pulses are generated by a colliding pulse mode-locked laser.

9. The method of claim 1 wherein the conductor is disposed in an integrated circuit.

10. Apparatus for measuring a voltage waveform of an electrical signal on an electrical conductor comprising:
    means for generating the signal on the conductor,
    a probe comprising a crystal exhibiting a longitudinal electro-optic effect,
    means for positioning the crystal over or on the conductor,
    means for directing a polarized light beam through the crystal along a direction essentially perpendicular to the conductor, birefringence being induced in the crystal and the polarization of the beam being modulated in response essentially to only those components of the electric field generated by the signal which are perpendicular to the conductor, and
    means for detecting the modulated polarization of the beam to generate a voltage waveform corresponding to that on the conductor.

11. The apparatus of claim 10 wherein the crystal is selected from the group consisting of KDP, KD*P, GaAs, ZnTe, CdTe, and CuCl.

12. The apparatus of claim 10 wherein the crystal has an end face positioned over or on the conductor and a backface maintained at a referencepotential.

13. The apparatus of claim 12 including a conductive layer disposed on the backface.

14. The apparatus of claim 12 including a reflector disposed on the end face of the crystal.

15. The apparatus of claim 10 wherein the directing means includes means for generating the light beam as a train of optical pulses having a duration of about a picosecond or less.

16. The apparatus of claim 15 wherein the generating means comprises a laser.

17. The apparatus of claim 16 wherein the generating means comprises a colliding pulse mode-locked laser.

18. The apparatus of claim 10 wherein the conductor is disposed in an integrated circuit.

19. The apparatus of claim 11, 12, 13 or 14 wherein the probe comprises a transparent support and a tip formed from the crystal and mounted on the support.

20. The apparatus of claim 19 wherein the tip has the shape of a truncated pyramid.

* * * * *